(12) United States Patent
Kim

(10) Patent No.: US 12,288,829 B2
(45) Date of Patent: Apr. 29, 2025

(54) TRANSPARENT PHOTOVOLTAIC CELL

(71) Applicant: CHEONGJU UNIVERSITY Industry & Academy Cooperation Foundation, Cheongju-si (KR)

(72) Inventor: Je Ha Kim, Daejeon (KR)

(73) Assignee: CHEONGJU UNIVERSITY Industry & Academy Cooperation Foundation, Cheongju-si (KR)

( * ) Notice: Subject to any disclaimer, the term of this patent is extended or adjusted under 35 U.S.C. 154(b) by 99 days.

(21) Appl. No.: 18/192,410

(22) Filed: Mar. 29, 2023

(65) Prior Publication Data

US 2023/0238468 A1     Jul. 27, 2023

Related U.S. Application Data

(63) Continuation of application No. PCT/KR2021/000434, filed on Jan. 13, 2021.

(30) Foreign Application Priority Data

Oct. 22, 2020     (KR) .......................... 10-2020-0137580

(51) Int. Cl.
    *H01L 31/054*     (2014.01)
(52) U.S. Cl.
    CPC ...... *H01L 31/0543* (2014.12); *H01L 31/0547* (2014.12)
(58) Field of Classification Search
    CPC .................... H01L 31/0543; H01L 31/0547
    See application file for complete search history.

(56) References Cited

U.S. PATENT DOCUMENTS

| 6,180,871 B1* | 1/2001 | Campbell ........... H01L 31/1872 |
| | | 136/258 |
| 9,196,765 B2 | 11/2015 | Yang et al. |
| 2010/0258163 A1* | 10/2010 | Zheng ............... H01L 31/02366 |
| | | 438/57 |
| 2010/0279458 A1 | 11/2010 | Yeh et al. |

(Continued)

FOREIGN PATENT DOCUMENTS

| KR | 10-2009-0005872 A | 1/2009 |
| KR | 10-2009-0030362 A | 3/2009 |
| KR | 10-2014-0007055 A | 1/2014 |

(Continued)

OTHER PUBLICATIONS

International Search Report mailed Jan. 27, 2022 in International Application No. PCT/KR2021/000434.

*Primary Examiner* — Devina Pillay
(74) *Attorney, Agent, or Firm* — Knobbe, Martens, Olson & Bear LLP

(57) ABSTRACT

A transparent photovoltaic cell is proposed. The transparent photovoltaic cell may include a transparent substrate, a plurality of micro-pillars arranged on an upper part of the transparent substrate and formed with respective transparent windows, through which incident sunlight transmits, on respective upper parts thereof. The transparent photovoltaic cell may also include a photoelectric converter formed on an upper surface of the transparent substrate between each of the plurality of micro-pillars and on side surfaces of each micro-pillar, and configured to generate power through absorption of incident sunlight.

8 Claims, 7 Drawing Sheets

(56) References Cited

U.S. PATENT DOCUMENTS

2010/0330733 A1    12/2010  Basol
2011/0088778 A1*  4/2011  Lin ................... H01L 31/1884
                                                                    136/257

FOREIGN PATENT DOCUMENTS

| KR | 10-2018-0081338 A | 7/2018 |
| KR | 10-2019-0003052 A | 1/2019 |
| KR | 10-2020-0080768 A | 7/2020 |

* cited by examiner

FIG. 5 (cross section of B-B')

TRANSPARENT PHOTOVOLTAIC CELL

CROSS-REFERENCE TO RELATED APPLICATIONS

This application is a continuation application, and claims the benefit under 35 U.S.C. § 120 and § 365 of PCT Application No. PCT/KR2021/000434, filed on Jan. 13, 2021, which claims priority to Korean Patent Application No. 10-2020-0137580 filed on Oct. 22, 2020, both of which are hereby incorporated by reference in their entirety.

BACKGROUND

Technical Field

The present disclosure relates to a transparent photovoltaic cell.

Description of Related Technology

The uses of hybrid convergence photovoltaic cells are expanding to Building Integrated Photovoltaics (BIPV), which are applied to or integrated in buildings, and wireless independent energy sources for Internet of Things (IoT) devices coupled to automobiles or coupled to sensors for which independent operations thereof are important.

SUMMARY

The present disclosure is to provide a transparent photovoltaic cell having a three-dimensional structure that satisfies two conflicting characteristics of high transparency and high power conversion efficiency with respect to visible light of incident sunlight.

According to one aspect of the present disclosure, a transparent photovoltaic cell is disclosed.

According to an exemplary embodiment of the present disclosure, there is provided a transparent photovoltaic cell including: a transparent substrate; a plurality of micro-pillars arranged on an upper part of the transparent substrate and formed with respective transparent windows, through which incident sunlight transmits, on respective upper parts thereof; and a photoelectric converter formed on an upper surface of the transparent substrate between each of the plurality of micro-pillars and on side surfaces of each micro-pillar, and configured to generate power through absorption of incident sunlight.

Transmittance may be determined by a ratio of a total area of the transparent windows of the plurality of micro-pillars to a total area of the transparent photovoltaic cell, and an effective solar absorption area of the photoelectric converter may be adjusted according to heights of the plurality of micro-pillars.

The photoelectric converter may include: a transparent back electrode layer; a light absorbing layer; a transparent front electrode layer; and a transparent insulating layer, which are sequentially laminated, and the transparent windows may be formed by removing the light absorbing layer laminated on the upper parts of the plurality of micro-pillars.

The transparent photovoltaic cell may further include: grid ridges formed between each array of a predetermined number of micro-pillars, and formed with respective front electrode grids, connected to the transparent front electrode layer, on respective upper parts thereof; a front electrode pad structure formed with a front electrode bus bar connected to the transparent front electrode layer; and a back electrode pad structure formed with a back electrode bus bar connected to the transparent back electrode layer.

The transparent substrate, the front electrode pad structure, the grid ridges, the back electrode pad structure, and the plurality of micro-pillars may be collectively formed as one three-dimensional structure, and the transparent back electrode layer, the light absorbing layer, the transparent front electrode layer, and the transparent insulating layer may be sequentially laminated on a surface of the formed three-dimensional structure.

Before the transparent insulating layer is laminated, the front electrode grids may be formed on an upper part of the transparent front electrode layer laminated on the upper parts of the grid ridges.

When the light absorbing layer is removed to form the transparent windows, the back electrode bus bar may be formed on an upper part of the transparent back electrode layer laminated on the back electrode pad structure after the light absorbing layer and the transparent front electrode layer, which are laminated on the back electrode pad structure, are removed, so that the transparent back electrode layer laminated on the back electrode pad structure is exposed.

The front electrode bus bar may be formed on the upper part of the transparent front electrode layer laminated on the upper part of the front electrode pad structure before the transparent insulating layer is laminated.

The transparent photovoltaic cell may further include a light reflecting film formed on a lower part of the transparent substrate and configured to reflect or refract light other than visible light among the sunlight incident through the transparent windows, so as to feed back the light to the photoelectric converter.

The transparent photovoltaic cell according to the exemplary embodiment of the present disclosure may have the three-dimensional structure that satisfies two conflicting characteristics of the high transparency and high power conversion efficiency with respect to visible light of incident sunlight.

DETAILED DESCRIPTION

Figure 1:
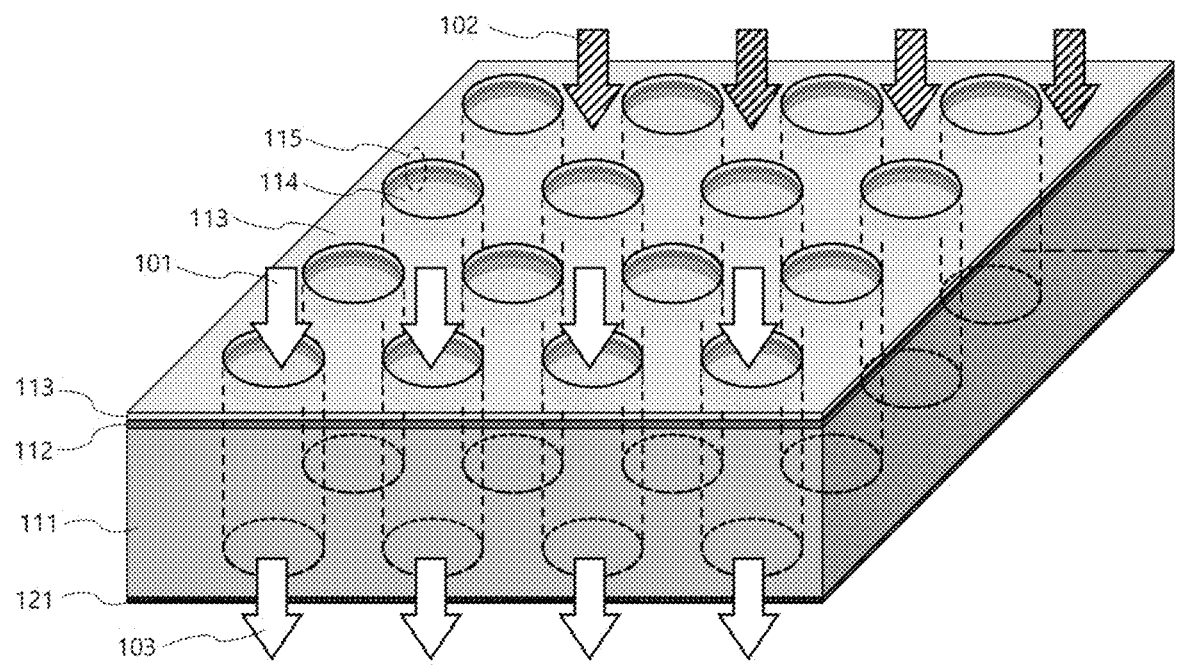
FIG. 1 is a view illustrating a cross-sectional structure of a transparent photovoltaic cell.

A photovoltaic cell, or solar cell, is essentially a device manufactured to maximally convert all output of incident light into electric power. That is, since the photovoltaic cell device should most efficiently absorb all incident sunlight, it is desirable that the light transmittance of the device is maximally decreased. Meanwhile, black body radiation from the sun shows that light output thereof has the highest point in a visible-light wavelength region. Accordingly, since incident visible light is absorbed to the fullest extent possible and used for power conversion in order to have highest power conversion efficiency, the photovoltaic cell is made to be opaque. Accordingly, in order to ensure the visible light transparency of the photovoltaic cell, a large loss in the power conversion efficiency of the photovoltaic cell should be taken into account. Due to such characteristics, hybrid convergence of the photovoltaic cell is subject to many limitations and its usability is reduced. That is, while the development of a device having the characteristics of transmitting visible light is required, since all light absorbing layer materials (organic, inorganic, etc.) currently used in the photovoltaic cell are capable of absorbing visible light, both of the transparency and high efficiency of the photovoltaic cell may not be satisfied at the same time. Therefore, a photovoltaic cell having a geometric device structure is required to satisfy these two conflicting characteristics.

Theoretically, a photovoltaic cell uses the principle of photoelectric effects of a light absorber. That is, the light absorber absorbs photons having light energy greater than band gap energy (Eg) so as to be in a state of excitation, thereby generating pairs of photoelectrons and positive holes. Thus, the power produced by the photovoltaic cell is proportional to the intensity of sunlight, the band gap energy (Eg) of a semiconductor, photo-absorption coefficients, an effective solar absorption area, etc. That is, as a cut-off wavelength is larger (or a band gap is smaller) and as a light-receiving area of a cell is larger, the light absorber is able to absorb more photons, so that more power is produced, whereby power conversion efficiency of the power generated per unit area is increased.

In addition, when an object (i.e., a substance) is transparent, it means that light transmitting through the object is incident to the human eye. The wavelength band of visible light that the human eye recognizes is 0.38 to 0.78 μm. This visible light wavelength band lies in the middle of the Boltzmann distribution for solar black body radiation, and occupies a region having the largest intensity. For this reason, the absorption of visible light has the greatest effect on power conversion efficiency (PCE) of a photovoltaic cell. Accordingly, the transparent photovoltaic cell manufactured to simply transmit visible light has no way but to transmit the visible light and absorb only ultraviolet and infrared light, which are invisible to the human naked eye and have low solar intensity, for photoelectric conversion, so it is unavoidable that the power conversion efficiency is lowered.

FIG. 1 is a view illustrating a cross-sectional structure of a transparent photovoltaic cell.

Referring to FIG. 1, in order to ensure transparency, the transparent photovoltaic cell has been applied with a method of providing holes through which incident light can transmit without being absorbed by an incident surface of the photovoltaic cell, so as to secure an effective transmission area of incident light.

The transparent photovoltaic cell of FIG. 1 may be manufactured as follows. First, an n-type emitter layer 112 is formed on a single crystal p-type silicon wafer 111 used as a light absorber through n-type impurity doping. Here, the n-type emitter layer 112 and an internal p-type semiconductor absorber layer or wafer 111 is configured to form a pn junction diode. Next, a SiNx passivation layer 113 is formed on the n-type emitter layer 112, so as to protect the internal pn junction diode layer. In a partial area of the formed SiNx passivation layer 113, an internal n-type emitter layer 112 and a metal (e.g., Ag) electrode are configured to make electrical ohmic contact, so that an n-type front electrode is formed. Next, a p-type back electrode 121 is formed by a metal thin film formed on the bottom surface of the p-type silicon wafer 111.

Next, in order to ensure light transmittance, light transmitting holes 114 having a predetermined diameter are formed according to uniform array arrangement by a dry etching method so that sunlight incident on the photovoltaic cell may transmit therethrough. Accordingly, the transmittance of the incident light may be determined by a ratio of the total area of arrays of the light transmitting holes 114 to an effective area of the photovoltaic cell.

In a case of being incident through the light transmitting holes 114 when sunlight 101 and 102 is perpendicularly incident on the surface of the photovoltaic cell, 100% of sunlight 103 may transmit without absorption. Whereas, in a case of being incident through gaps between the light transmitting holes 114, sunlight 101 and 102 is absorbed by the photovoltaic cell to generate power. In this case, a photovoltaic cell device layer 115 is formed only on the surface of the transparent photovoltaic cell, so when the total area of the arrays of the light transmitting holes 114 increases, an effective solar absorption area decreases, and as a result, the power conversion efficiency of the photovoltaic cell decreases as the transmittance thereof increases.

Figure 2:
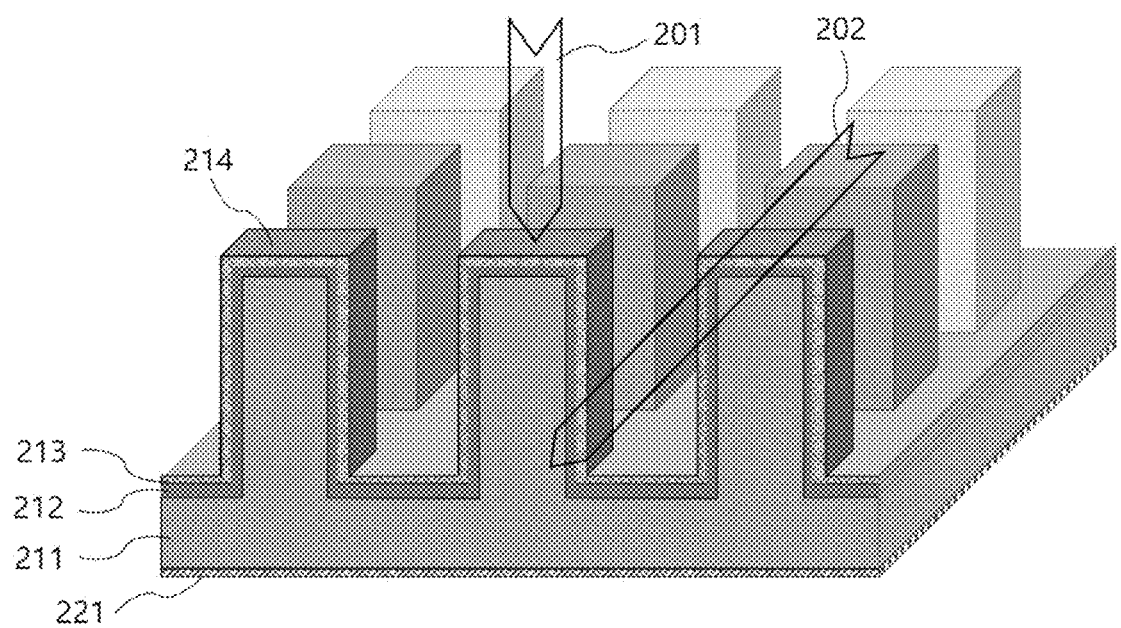
FIG. 2 is a view illustrating a structure of a three-dimensional photovoltaic cell.

FIG. 2 is a view illustrating a structure of a three-dimensional photovoltaic cell.

Referring to FIG. 2, micro-pillars 214 constituting a photovoltaic cell are manufactured by etching a Si wafer that is a material of a p-type semiconductor substrate 211, which is a light absorber.

A schematic structure of the three-dimensional photovoltaic cell of FIG. 2 is as follows. A p-type semiconductor substrate 211 having a three-dimensional structure thereof and forming a light absorber is formed and an n-type emitter layer 212 is formed on the p-type absorber 211 through n-type impurity doping. In this way, the n-type emitter layer 212 form a pn junction diode with the internal p-type semiconductor substrate or absorber 211. Next, a SiNx passivation layer 213 is formed on the n-type emitter layer 212, so as to protect the internal pn junction diode layer. In a partial area of the formed SiNx passivation layer 213, an internal n-type emitter layer 212 and a metal (e.g., Ag) electrode are configured to make electrical ohmic contact, so that an n-type front electrode is formed. Next, a p-type back electrode 221 is formed by a metal thin film formed on the bottom surface of the p-type semiconductor substrate 211.

The three-dimensional photovoltaic cell based on the crystalline silicone (or germanium) light absorption semiconductor, which is configured as described above, may not only generate electricity on the surface of the photovoltaic cell by sunlight 201 perpendicularly incident, but also perform effective photoelectric conversion by sunlight 202 incident at an inclined angle. That is, since sunlight 202 incident at the inclined angle may be absorbed while transmitting through gaps between micro-pillars 214 constituting an array, the light trapping characteristics of Si (or Ge) having a low light absorption rate may be greatly improved. Such a structure may provide a strong point of offsetting a decrease in power conversion efficiency due to low light absorption of Si (or Ge) having the low light absorption rate even without a texturing structure on surfaces.

The singular forms used in the present specification are intended to include the plural forms as well, unless the context clearly indicates otherwise. In the present specification, terms such as "consisting of" or "comprising" should not be construed as necessarily including all of the various components or various steps described in the specification, and it should be construed that some components or some steps among the various components or various steps may not be included, or additional components or steps may be further included. In addition, terms such as " . . . unit" and " . . . module" described in the specification mean units that process at least one function or operation, which may be implemented as hardware or software, or a combination of hardware and software.

Hereinafter, various exemplary embodiments of the present disclosure will be described in detail with reference to the accompanying drawings.

Figure 3:
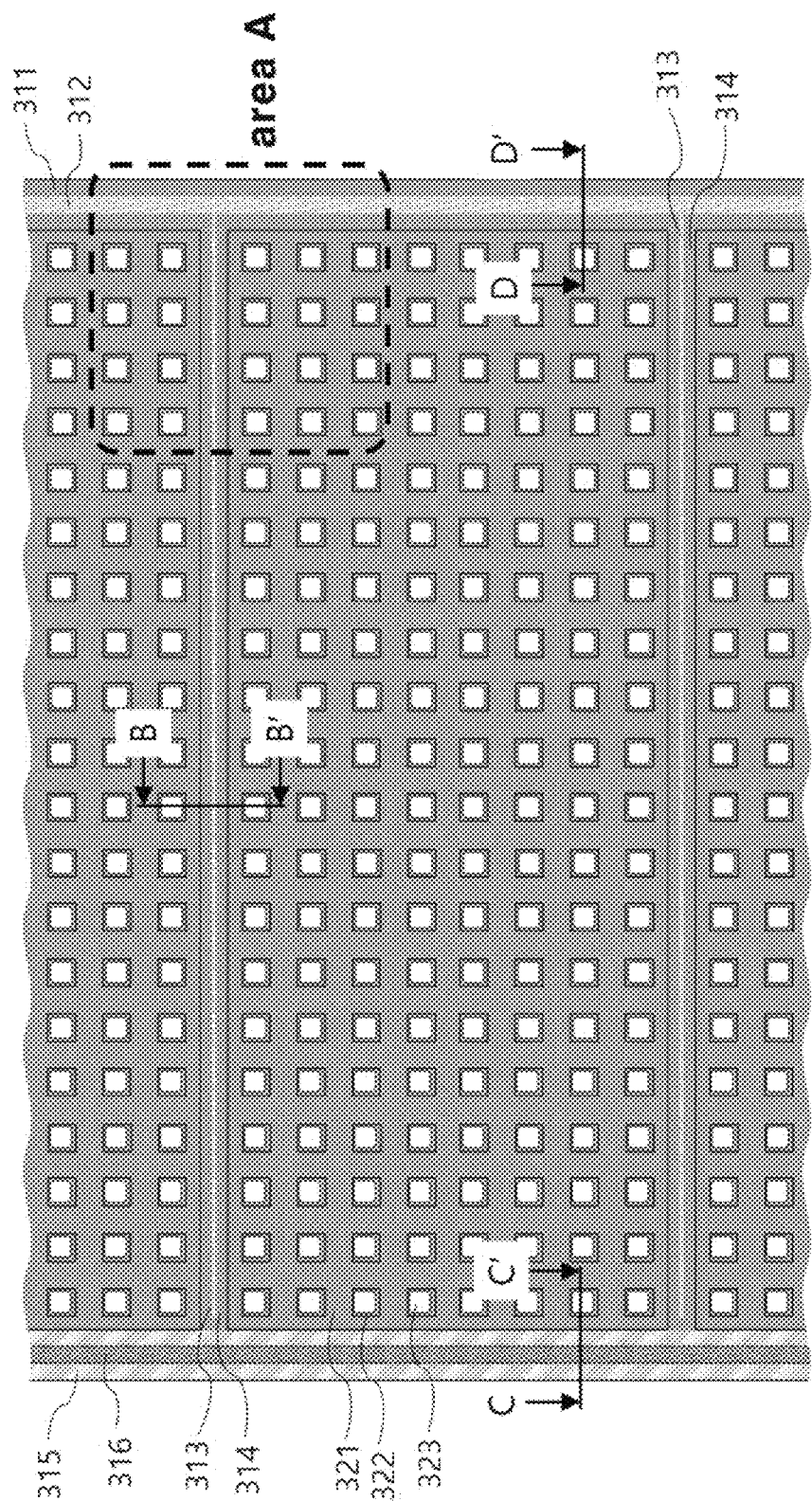
FIG. 3 is a view illustrating a front surface of a transparent photovoltaic cell according to an exemplary embodiment of the present disclosure.
Figure 4:
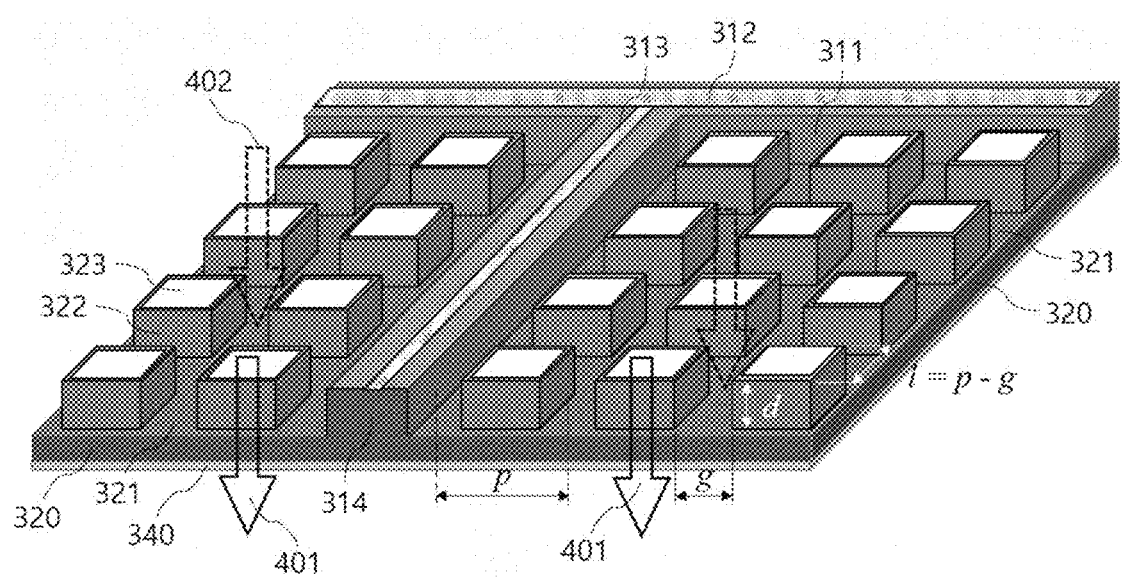
FIG. 4 is a three-dimensional view illustrating area A shown in FIG. 3.
Figure 5:
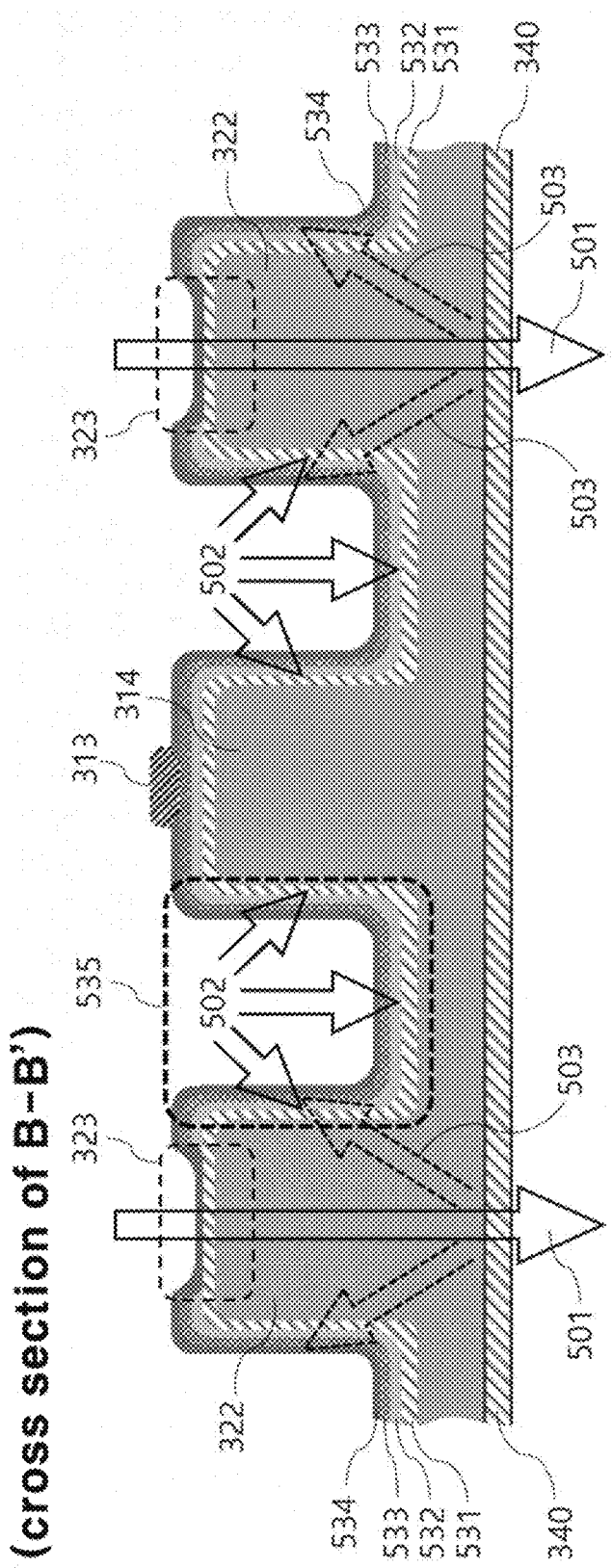
FIG. 5 is a cross-sectional view taken along a line BB' shown in FIG. 3.
Figure 6:
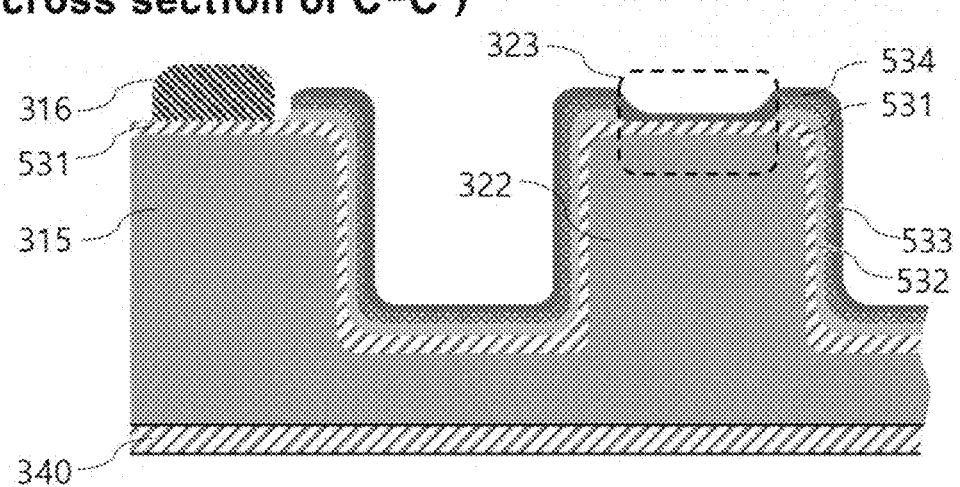
FIG. 6 is a cross-sectional view taken along a line CC' shown in FIG. 3.
Figure 7:
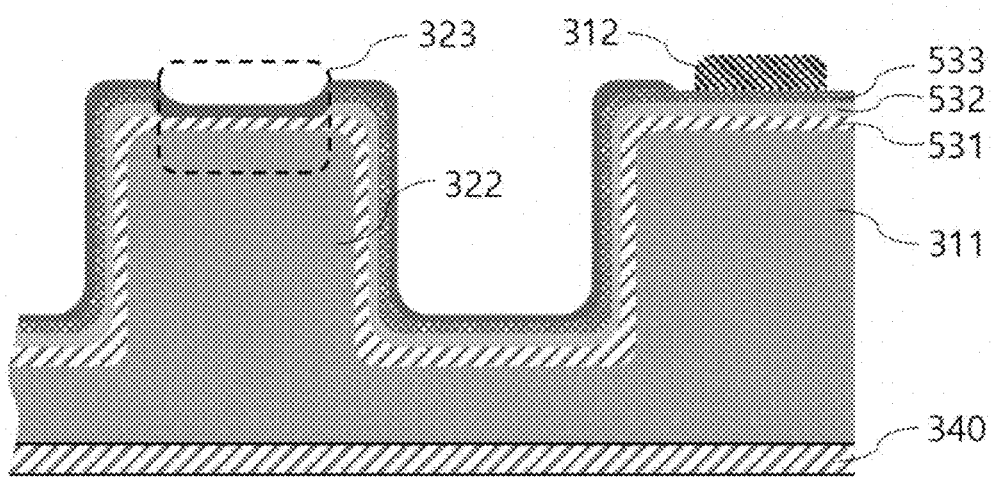
FIG. 7 is a cross-sectional view taken along a line DD' shown in FIG. 3.

FIG. 3 is a view illustrating a front surface of a transparent photovoltaic cell according to an exemplary embodiment of the present disclosure. FIG. 4 is a three-dimensional view illustrating area A shown in FIG. 3. FIG. 5 is a cross-sectional view taken along a line BB' shown in FIG. 3. FIG. 6 is a cross-sectional view taken along a line CC' shown in FIG. 3. FIG. 7 is a cross-sectional view taken along a line DD' shown in FIG. 3. Hereinafter, the transparent photovoltaic cell according to according to the exemplary embodiment of the present disclosure will be described with reference to FIGS. 3 to 7.

First, referring to FIGS. 3 and 4, fundamentally, the transparent photovoltaic cell according to the exemplary embodiment of the present disclosure may be configured to include a transparent substrate 320 and a plurality of micro-pillars 322 arranged at regular gaps on an upper part of the transparent substrate 320.

Here, the transparent substrate 320 and the micro-pillars 322 may be formed of a transparent material such as glass.

A transparent window 323 through which incident sunlight 401 is transmitted is formed on an upper part of each micro-pillar 322. In addition, a photoelectric converter for generating power through light absorption 402 may be formed on an upper surface 321 of the transparent substrate 320 between the micro-pillars 322 and on side surfaces of the micro-pillars 322. Thus, the visible light transmittance of the transparent photovoltaic cell according to according to the exemplary embodiment of the present disclosure may be determined as a ratio of the total area of transparent windows 323 of the plurality of micro-pillars 322 to the total area of the transparent photovoltaic cell.

In addition, on the transparent photovoltaic cell, grid ridges 314 are formed at regular gaps, that is, between each array of a predetermined number of micro-pillars 322. A front electrode grid 313 is formed on an upper part of each grid ridge 314. As described above, the grid ridges 314 and front electrode grids 313 are to collect generated photocurrents in advance, thereby maximally decreasing photocurrent loss due to the scattering and recombination of charges.

In addition, a front electrode pad structure 311 and a back electrode pad structure 315, which are for connecting respective generated photocurrents to an external load, are formed at both ends of the transparent photovoltaic cell. A front electrode bus bar 312 and a back electrode bus bar 316 may be formed on respective upper parts of the front electrode pad structure 311 and the back electrode pad structure 315, so as to form positive and negative electrodes.

For example, as shown in FIG. 4, the transparent substrate 320, the front electrode pad structure 311, the grid ridges 314, and the plurality of micro-pillars 322 may be collectively formed as one three-dimensional structure by using a micro imprinting process, which is a MEMS process. In addition, by using a thin film deposition method, a photoelectric converter for generating power through light absorption 402 may be formed on the surface of the three-dimensional structure formed as described above.

Since the photoelectric converter is not present in the transparent window 323 on the upper part of each micro-pillar 322, sunlight 401 perpendicularly incident on the transparent window 323 may transmit without being absorbed. Meanwhile, sunlight 402 incident between the micro-pillars 322 is absorbed by the formed photoelectric converter.

As described above, the transmittance may be determined as the ratio of the total area of the transparent windows 323 of the plurality of fine pillars 322 to the total area of the transparent photovoltaic cell. Referring to FIG. 4, by a repetition period p and a gap g of a corresponding micro-pillar 322, an area of a transparent window 323 is determined (i.e., 1=p−g). Therefore, an increase in transmittance means a decrease in a horizontal plane 321 of the photovoltaic cell perpendicular to incident sunlight. In this case, an effective solar absorption area is reduced, and to compensate for this reduction, a height d of the corresponding micro-pillar 322 may be greatly increased. In addition, a light reflecting film 340 for reflecting and refracting light (i.e., ultraviolet rays, infrared rays, etc.) other than visible light among the transmitted sunlight 401 to feed back the light to the photoelectric converter may be formed at a lower part of the transparent substrate 320.

Hereinafter, a structure of the transparent photovoltaic cell according to the exemplary embodiment of the present disclosure will be described in detail with reference to cross-sectional views shown in FIGS. 5 to 7.

FIG. 5 illustrates a cross-section of the transparent photovoltaic cell including a grid ridge 314 and micro-pillars 322 adjacent to the grid ridge 314. FIG. 6 illustrates a cross-section of the transparent photovoltaic cell including a back electrode pad structure 315 and a micro-pillar 322 adjacent to the back electrode pad structure 315. FIG. 7 illustrates a cross-section of the transparent photovoltaic cell including a front electrode pad structure 311 and a micro-pillar 322 adjacent to the front electrode pad structure 311.

First, as described above, the transparent substrate 320, the front electrode pad structure 311, the grid ridges 314, the back electrode pad structure 315, and the plurality of micro-pillars 322 may be collectively formed into one three-dimensional structure.

In addition, a transparent back electrode layer 531, a light absorbing layer 532, a transparent front electrode layer 533, and a transparent insulating layer 534 may be sequentially laminated on the surface of the integrally formed three-dimensional structure.

Here, the light absorbing layer 532 absorbs light of all wavelengths of incident sunlight 502. Accordingly, before the transparent insulating layer 534 is laminated on the surface of the three-dimensional structure during sequential lamination, the light absorbing layer 532 and transparent front electrode layer 533, which are laminated on the upper parts of the micro-pillars 322 are removed, whereby the transparent windows 323 through which incident sunlight 401 is transmitted may be formed on the respective upper parts of the micro-pillars 322.

As shown in FIG. 5, before the transparent insulating layer 534 is laminated, a front electrode grid 313 may be formed on an upper part of the transparent front electrode layer 533 laminated on the grid ridge 314. In this way, the transparent front electrode layer 533 and the front electrode grid 313 may be electrically connected to each other.

As shown in FIG. 6, when the transparent window 323 is formed by removing the light absorbing layer 532, the light absorbing layer 532 and the transparent front electrode layer 533, which are laminated on the back electrode pad structure 315, are also removed so that the transparent back electrode layer 531 laminated on the back electrode pad structure 315 is exposed. In addition, a back electrode bus bar 316 may be formed on an upper part of the transparent back electrode layer 531 laminated on the back electrode pad structure 315. In this way, the transparent back electrode layer 531 and the back electrode bus bar 316 may be electrically connected to each other.

For example, the back electrode bus bar 316 may be formed through depositing of a metal such as gold (Au) or silver (Ag) on the upper part of the transparent back electrode layer 531, thereby forming a p-type electrode of the transparent photovoltaic cell.

As shown in FIG. 7, before the transparent insulating layer 534 is laminated, a front electrode bus bar 312 may be formed on the upper part of the transparent front electrode layer 533 laminated on the upper part of the front electrode pad structure 311. In this way, the transparent front electrode layer 533 and the front electrode bus bar 312 may be electrically connected to each other.

For example, the front electrode bus bar 312 may be formed through depositing of the metal such as gold (Au) or silver (Ag) on the upper part of the transparent front electrode layer 533, thereby forming an n-type electrode of the transparent photovoltaic cell.

In addition, the transparent insulating layer 534 is a passivation layer for protecting the entire surface of the transparent photovoltaic cell, and may be, for example, a SiNx passivation layer.

Referring back to FIG. 5, in sunlight 501 incident through the transparent windows 323, light of all wavelength bands is transmitted and no light absorption occurs, so it may result in a net loss of the transparent photovoltaic cell. However, in order to compensate for such a net loss, the height d of each micro-pillar 322 is controlled according to a preset target transmittance, whereby the effective solar absorption area of the photoelectric converter formed on the upper surface 321 of the transparent substrate 320 between the micro-pillars 322 and the side surfaces of the micro-pillars 322 may be adjusted.

In addition, among the transmitted sunlight 501 transmitting through the transparent windows 323, invisible ultraviolet (UV) and infrared (IR) rays do not affect visible light transmittance. Therefore, in order to utilize light other than visible light for photoelectric conversion, a light reflecting film 340 is formed on the lower part of the transparent substrate 320, so that reflected and refracted sunlight 503 may be fed back to the light absorbing layer 532 on an incident surface side. This feeding back may contribute to an increase in power conversion efficiency by generating an effect of increasing scattering and optical paths for absorption of ultraviolet and infrared rays.

The above-described exemplary embodiment of the present disclosure are disclosed for illustrative purposes, and those skilled in the art having ordinary knowledge of the present disclosure will be able to make various modifications, changes, and additions within the spirit and scope of the present disclosure, and such modifications, changes, and additions should be considered to fall within the scope of the following claims.

What is claimed is:

1. A transparent photovoltaic cell comprising:
   a transparent substrate;
   a plurality of micro-pillars arranged on an upper part of the transparent substrate and comprising respective transparent windows, through which incident sunlight transmits, on respective upper parts thereof; and
   a photoelectric converter formed on an upper surface of the transparent substrate between the plurality of micro-pillars and on side surfaces of each micro-pillar, and configured to generate power through absorption of incident sunlight,
   wherein the photoelectric converter comprises:
      a transparent back electrode layer;
      a light absorbing layer;
      a transparent front electrode layer; and
      a transparent insulating layer, wherein the light absorbing layer, the transparent front electrode layer, and the transparent insulating layer are sequentially laminated, and
   wherein the transparent windows are configured to be formed by removing the light absorbing layer laminated on the upper parts of the plurality of micro-pillars.

2. The transparent photovoltaic cell of claim 1, wherein transmittance is configured to be determined by a ratio of a total area of the transparent windows of the plurality of micro-pillars to a total area of the transparent photovoltaic cell, and
   wherein an effective solar absorption area of the photoelectric converter is configured to be adjusted according to heights of the plurality of micro-pillars.

3. The transparent photovoltaic cell of claim 1, further comprising:
   grid ridges formed between arrays of a predetermined number of micro-pillars, and comprising respective front electrode grids, connected to the transparent front electrode layer, on respective upper parts thereof;
   a front electrode pad structure comprising a front electrode bus bar connected to the transparent front electrode layer; and
   a back electrode pad structure comprising a back electrode bus bar connected to the transparent back electrode layer.

4. The transparent photovoltaic cell of claim 3, wherein the transparent substrate, the front electrode pad structure, the grid ridges, the back electrode pad structure, and the plurality of micro-pillars are collectively formed as one three-dimensional structure, and
   wherein the transparent back electrode layer, the light absorbing layer, the transparent front electrode layer, and the transparent insulating layer are sequentially laminated on a surface of the formed three-dimensional structure.

5. The transparent photovoltaic cell of claim 3, wherein the front electrode grids are formed on an upper part of the transparent front electrode layer laminated on the upper parts of the grid ridges, and the transparent insulating layer is laminated over the grid ridges.

6. The transparent photovoltaic cell of claim 3, wherein the back electrode bus bar is formed on an upper part of the transparent back electrode layer laminated on the back electrode pad structure so that the back electrode bus bar contacts the transparent back electrode layer laminated on the back electrode pad structure.

7. The transparent photovoltaic cell of claim 3, wherein the front electrode bus bar is formed on the upper part of the transparent front electrode layer laminated on the upper part of the front electrode pad structure.

8. The transparent photovoltaic cell of claim 1, further comprising:

a light reflecting film formed on a lower part of the transparent substrate and configured to reflect or refract light other than visible light among the sunlight incident through the transparent windows, so as to feed back the light to the photoelectric converter.

* * * * *